United States Patent
Tsujimoto et al.

(10) Patent No.: US 10,269,992 B2
(45) Date of Patent: Apr. 23, 2019

(54) SOLAR CELL

(71) Applicant: Panasonic Intellectual Property Management Co., Ltd., Osaka-shi, Osaka (JP)

(72) Inventors: Hironobu Tsujimoto, Osaka (JP); Naohiro Hitachi, Osaka (JP); Masaki Shima, Kyoto (JP); Toshie Kunii, Gifu (JP); Shingo Okamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/725,465

(22) Filed: May 29, 2015

(65) Prior Publication Data
US 2015/0263194 A1    Sep. 17, 2015

Related U.S. Application Data

(63) Continuation of application No. PCT/JP2013/006965, filed on Nov. 27, 2013.

(30) Foreign Application Priority Data

Nov. 30, 2012 (JP) ................. 2012-263500

(51) Int. Cl.
*H01L 31/0224* (2006.01)
*H01L 31/02* (2006.01)

(52) U.S. Cl.
CPC .. *H01L 31/022433* (2013.01); *H01L 31/0201* (2013.01); *Y02E 10/50* (2013.01)

(58) Field of Classification Search
CPC ............ H01L 31/0224; H01L 31/0201; H01L 31/022425; H01L 31/022433
See application file for complete search history.

(56) References Cited

U.S. PATENT DOCUMENTS

| | | | |
|---|---|---|---|
| 5,397,400 A * | 3/1995 | Matsuno | H01L 31/02168 136/256 |
| 6,573,445 B1 | 6/2003 | Burgers | |
| 2007/0095387 A1 | 5/2007 | Fujii et al. | |
| 2008/0149161 A1 | 6/2008 | Nishida et al. | |
| 2010/0294356 A1* | 11/2010 | Parikh | H01L 31/022433 136/256 |
| 2011/0011440 A1* | 1/2011 | Hioki | H01L 31/02243 136/244 |

(Continued)

FOREIGN PATENT DOCUMENTS

| | | | | |
|---|---|---|---|---|
| CN | 103280465 A * | 9/2013 | ......... | H01L 31/0201 |
| EP | 2219226 A2 | 8/2010 | | |

(Continued)

OTHER PUBLICATIONS

Machine translation of WO-2014172926-A1 (Year: 2014).*

(Continued)

*Primary Examiner* — Allison Bourke
(74) *Attorney, Agent, or Firm* — Cantor Colburn LLP

(57) ABSTRACT

A solar cell has multiple busbar electrodes formed at intervals and multiple finger electrodes formed between the busbar electrodes. The finger electrodes comprise multiple finger parts connected only to one busbar electrode and multiple finger parts connected to only another busbar electrode. The adjacent multiple finger parts are connected to one another, and the adjacent multiple finger parts are connected to one another.

10 Claims, 8 Drawing Sheets

(56) References Cited

U.S. PATENT DOCUMENTS

| | | | |
|---|---|---|---|
| 2011/0277835 A1* | 11/2011 | Masson | H01L 31/02243 136/256 |
| 2012/0192932 A1* | 8/2012 | Wu | H01L 31/02242 136/252 |
| 2013/0247955 A1* | 9/2013 | Baba | H01L 31/022433 136/244 |
| 2013/0306129 A1* | 11/2013 | Tohoda | H01L 31/022433 136/244 |
| 2014/0069494 A1* | 3/2014 | Liu | H01L 31/02242 136/256 |
| 2014/0096823 A1 | 4/2014 | Fu et al. | |
| 2014/0318613 A1* | 10/2014 | Von Campe | H01L 31/0201 136/256 |
| 2015/0263194 A1 | 9/2015 | Tsujimoto et al. | |
| 2015/0287851 A1 | 10/2015 | Endo et al. | |

FOREIGN PATENT DOCUMENTS

| | | | | |
|---|---|---|---|---|
| JP | S55139560 | A | | 10/1980 |
| JP | H09283781 | A | | 10/1997 |
| JP | 2002530894 | A | | 9/2002 |
| JP | 2005317904 | A | | 11/2005 |
| JP | 2005353904 | A | | 12/2005 |
| JP | 2008135655 | A | | 6/2008 |
| JP | 2008159895 | A | | 7/2008 |
| JP | 2009290234 | A | | 12/2009 |
| JP | 2010147107 | A | | 7/2010 |
| JP | 2010239167 | A | * | 10/2010 |
| JP | 3188712 | U | | 2/2014 |
| JP | 3193590 | U | | 10/2014 |
| JP | 2015532535 | A | | 11/2015 |
| WO | 2014069118 | A1 | | 5/2014 |
| WO | 2014083846 | A1 | | 6/2014 |
| WO | WO-2014172926 | A1 | * | 10/2014 ......... H01L 31/0201 |

OTHER PUBLICATIONS

International Search Report corresponding to Application No. PCT/JP2013/006965; dated Dec. 24, 2013, with English translation.

* cited by examiner

ABA
SOLAR CELL

CROSS REFERENCE TO RELATED APPLICATIONS

This application is a continuation under 35 U.S.C. § 120 of PCT/JP2013/006965, filed Nov. 27, 2013, which is incorporated herein reference and which claimed priority under 35 U.S.C. § 119 to Japanese Application No. 2012-263500, filed Nov. 30, 2012, the entire content of which is also incorporated herein by reference.

TECHNICAL FIELD

The present invention relates to a solar cell.

BACKGROUND ART

A solar cell includes an electrode that collects carriers generated by a photoelectric conversion member. For example, screen printing of a conductive paste is performed on the photoelectric conversion member, and thereby, the electrode can be formed (see Patent Literature 1, for example).

CITATION LIST

Patent Literature

Patent Literature 1: Japanese Patent Laid-Open Publication No. 2009-290234

SUMMARY OF INVENTION

Technical Problem

The formation pattern of the electrode affects the performance of the solar cell such as photoelectric conversion efficiency. Therefore, it is important to improve the formation pattern of the electrode to enhance the performance of the solar cell.

Solution to Problem

A solar cell according to the present invention includes: multiple busbar electrodes formed at intervals from one another; and multiple finger electrodes formed in each interval of the busbar electrodes, in which the finger electrodes include multiple first finger parts connected to only one of the busbar electrodes, and multiple second finger parts connected to only the other of the busbar electrodes, with adjacent first finger parts among the multiple first finger parts being connected to one another, and adjacent second finger parts among the multiple second finger parts being connected to one another.

Advantageous Effect of Invention

According to a solar cell of the present invention, it is possible to enhance the performance of the solar cell.

DESCRIPTION OF EMBODIMENT

Figure 1:
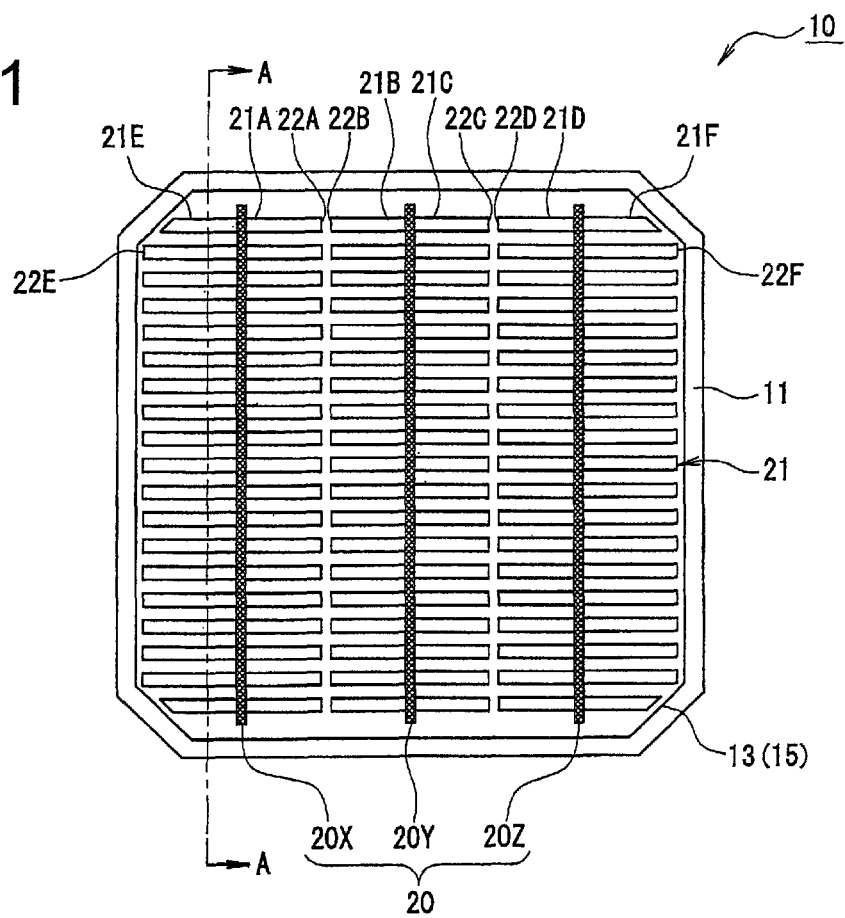
FIG. 1 is a view of a solar cell that is an example of an embodiment of the present invention, as viewed from the side of a light receiving surface.

An embodiment according to the present invention will be described in detail, with reference to the drawings. The present invention is not limited to the following embodiment. Further, the reference drawings in the embodiment are schematically described, and in some cases, the dimension ratios and the like of constituent elements illustrated in the drawings are different from actual articles. The specific dimension ratios and the like should be judged in consideration of the following description.

In the present description, the term "nearly **", as in "nearly identical" for example, is intended to include a case of being recognized as being substantially identical as well as that of being completely identical.

Figure 2:
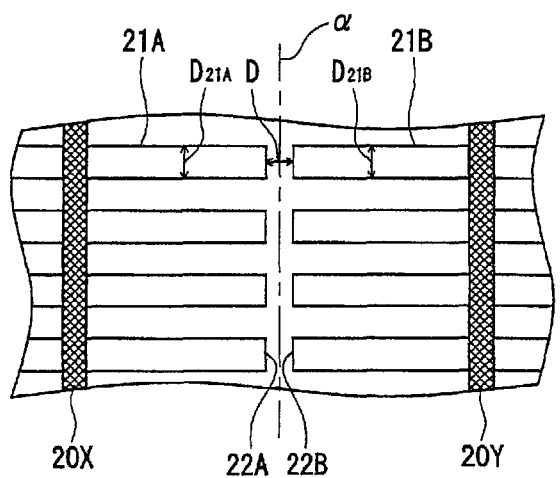
FIG. 2 is an enlarged view of a principal part of FIG. 1.
Figure 3:
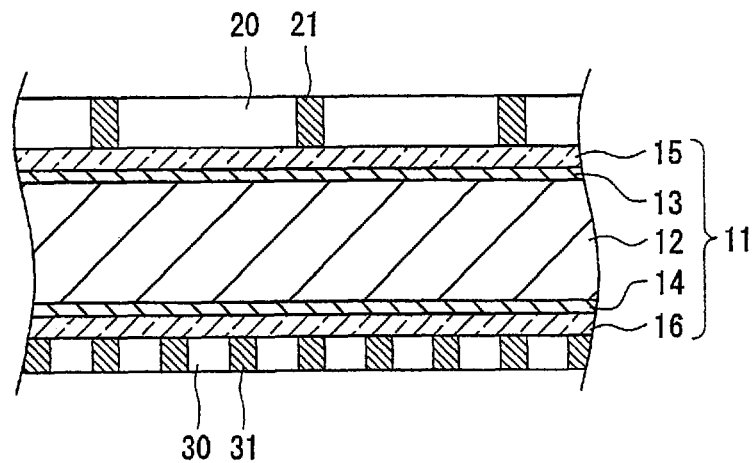
FIG. 3 is a sectional view taken from line A-A in FIG. 1.

FIG. 1 is a plan view of a solar cell 10 that is an example of an embodiment of the present invention, as viewed from the side of a light receiving surface. FIG. 2 is an enlarged view of the interval between busbar electrodes 20X, 20Y in FIG. 1. FIG. 3 is a sectional view taken from line A-A in FIG. 1, and is a view showing a section when the solar cell 10 is cut in the thickness direction by a plane orthogonal to the longitudinal direction of finger electrodes 21, 31. Here, the "light receiving surface" means a surface that is a surfaces of the solar cell 10 that solar light mainly enters, and a "back surface" means a surface on the opposite side to the light receiving surface. In other words, the back surface is a surface that has a larger in the formation area for the electrodes.

The solar cell 10 includes a photoelectric conversion member 11 that generates carriers by receiving light such as solar light, busbar electrodes 20 and finger electrodes 21 that are light-receiving-surface electrodes provided on the light receiving surface of the photoelectric conversion member 11, and busbar electrodes 30 and finger electrodes 31 that are back-surface electrodes provided on the back surface of the photoelectric conversion member 11. Compared to the light receiving surface, the back surface of the solar cell 10 is less affected by the light-shielding loss with respect to the photoelectric conversion property. Therefore, preferably, the back-surface electrodes should be formed so as to have a larger area than the light-receiving-surface electrodes.

The photoelectric conversion member 11 includes a substrate 12 composed of a semiconductor material such as crystalline silicon (c-Si), gallium arsenide (GaAs) or indium phosphide (InP), for example. Specific examples of the photoelectric conversion member 11 include a structure in which an n-type monocrystalline silicon substrate is applied as the substrate 12 and amorphous semiconductor layers 13, 14 and transparent conductive layers 15, 16 are formed in order on the substrate 12 (see FIG. 3). The amorphous semiconductor layer 13 has a layer structure in which an i-type amorphous silicon layer and a p-type amorphous silicon layer are formed in order, for example. The amorphous semiconductor layer 14 has a layer structure in which an i-type amorphous silicon layer and an n-type amorphous silicon layer are formed in order, for example. Preferably, the transparent conductive layers 15, 16 should be composed of a transparent conductive oxide resulting from doping a metallic oxide such as indium oxide ($In_2O_3$) and zinc oxide (ZnO) with tin (Sn), antimony (Sb) or the like.

The busbar electrodes 20 and other electrodes can be formed by the screen printing of a conductive paste, for example. The electrodes formed by this method are composed of a conductive filler such as silver (Ag) particles, and a binder resin. Further, the electrodes may be formed by an electroplating method. The electrodes formed by this method are composed of a metal such as Ag and copper (Cu).

The busbar electrode 20 is an electrode to which a wiring member is connected when the solar cell 10 is modularized, and collects carriers from the finger electrodes 21. A plurality of the busbar electrodes 20 are formed at intervals from one another. In the example shown in FIG. 1, three straight-linear busbar electrodes 20 are formed nearly parallel to and at nearly equal intervals from one another. Hereinafter, when the busbar electrodes 20 are distinctively described, they are referred to as busbar electrodes 20X, 20Y, 20Z in order from the left side on the plane of FIG. 1.

The width of the busbar electrode 20 may be thicker than the width of the finger electrode 21, and for example, may be about 0.5 mm to 1.5 mm. On the other hand, the width of the busbar electrode 20 may be made thinner, for reducing the electrode material. For example, the width of the busbar electrode 20 may be similar to the width of the finger electrode 21, or may be thinner than the width of the finger electrode 21. Here, the width of the finger electrode 21 may be about 30 µm to 200 µm, for example.

The finger electrodes 21 are electrodes in a thin line shape that are formed in a wide range on the light receiving surface for collecting the carriers generated in the photoelectric conversion member 11. A plurality of the finger electrodes 21 are formed in each interval of the busbar electrodes 20. In the example shown in FIG. 1, many finger electrodes 21 are formed so as to be nearly perpendicular to the busbar electrodes 20. Then, each of the finger electrodes 21 is connected to either of the busbar electrodes 20.

Preferably, the finger electrodes 21 should extend from the busbar electrodes 20X, 20Z to edge sides of the light receiving surface, in addition to each interval of the busbar electrodes 20. Hereinafter, the finger electrodes 21 formed between the busbar electrodes 20X, 20Y are referred to as finger parts 21A, 21B, the finger electrodes 21 formed between the busbar electrodes 20Y, 20Z are referred to as finger parts 21C, 21D, and the finger electrodes 21 extending from the busbar electrodes 20X, 20Z to the edge sides of the light receiving surface respectively are referred to as finger parts 21E, 21F.

In the example shown in FIG. 1, the finger parts formed in each interval of the busbar electrodes 20 have, in a planar view, the same formation pattern as one another. The finger parts 21E, 21F also have, in a planar view, the same formation pattern as one another. That is, the finger electrodes 21 are formed bisymmetric ally with respect to the central busbar electrode 20Y. Here, the "planar view" means a planar shape as viewed from the direction perpendicular to the plane on which the photoelectric conversion member 11 extends. Hereinafter, if there is no particular mention, the shape or formation pattern of the finger part means the shape or formation pattern of the light receiving surface or back surface in a planar view.

The formation pattern of the finger part will be described, by taking the finger parts 21A, 21B as an example. The finger part 21A is connected to only the busbar electrode 20X, and the finger part 21B is connected to only the busbar electrode 20Y. Then, the finger parts 21A, 21B are mutually formed on an identical straight line, for example. That is, it can be said that the finger parts 21A, 21B are finger parts resulting from dividing a straight-linear finger part connecting the busbar electrodes 20X, 20Y at an intermediate part in the longitudinal direction. Here, preferably, the multiple finger parts 21A, 21B each should have nearly the same length, and should be formed nearly parallel to and at nearly equal intervals from one another.

For example, the interval D between the finger parts 21A, 21B formed on an identical straight line is smaller than the interval $D_{21A}$ between the finger parts 21A and the interval $D_{21B}$ between the finger parts 21B. It is therefore possible to eliminate a region where the current collection is difficult, between the finger parts 21A, 21B. On the other hand, the interval D may be set so as to be larger than the interval $D_{21A}$ and the interval $D_{21B}$, as long as there is no problem in the current collection property. It is therefore possible to reduce the electrode material and to enhance the light receiving efficiency at the central part on the light receiving surface where the power generation efficiency is high.

Each finger part 21A is connected to at least one of the adjacent finger parts 21A. In the example shown in FIG. 1, they are connected in pairs. That is, one of the finger parts 21A is connected to one of two adjacent finger parts 21A. As a result, even when a part of the one finger part 21A is cut, the busbar electrode 20X can collect the carriers through the other finger part 21A that is connected.

The finger parts 21A are connected by connection finger parts 22A. For example, the connection finger part 22A is formed so as to be nearly perpendicular to each finger part 21A, and connects the longitudinal end parts (hereinafter, referred to simply as the end parts in some cases) of the adjacent finger parts 21A. The width and thickness of the connection finger part 22A may be smaller than the width and thickness of the finger part 21A, as long as there is no problem in the transportability of the above carriers. It is therefore possible to reduce the electrode material.

In the example shown in FIG. 1, it can be said that the finger electrode is formed such that the connection finger part 22A and the two finger parts 21A connected through the connection finger part 22A configure a continuous and nearly rectangular shape together with a part of the busbar electrode 20X. Here, in some cases, depending on the formation pattern, the finger parts and the connection finger part are seamlessly formed so that the border is unclear, or the finger parts are directly connected. The important thing is that the adjacent finger parts are connected, and the range of the connection finger part may be unclear.

Similarly, the finger parts 21B are connected in pairs by connection finger 22B. The connection finger parts 22A, 22B are formed so as to face one another nearly parallel to each other. That is, the connection finger parts 22A, 22B arranged between the busbar electrodes 20X, 20Y, and other connection finger parts 22C to 22D arranged between the busbar electrodes 20Y, 20Z are formed so as to be arrayed in the direction perpendicular to the busbar electrodes 20. Connection finger parts 22E, 22F are formed such that the end parts of the connection finger parts 22E, 22F are parallel to edge sides of the photoelectric conversion member 11 that they face, more specifically, edge sides of the amorphous semiconductor layer 13.

Also, the busbar electrodes 30 and the finger electrodes 31, which are the back-surface electrodes, can adopt the same structure and formation pattern as the above described light-receiving-surface electrodes. Preferably, the formation area of the finger electrodes 31 should be larger than the formation area of the finger electrodes 21. Here, to the back-surface electrodes, a metallic thin film layer composed of Ag or the like may be applied, instead of the busbar electrodes 30 and the finger electrodes 31.

In the solar cell 10 having the above configuration, for example, it is possible to reduce the electrode material without impairing the current collection property. Further, the solar cell 10 makes it possible to enhance the light receiving efficiency at the central part on the light receiving surface where the power generation efficiency is high, without impairing the current collection property. That is, according to the solar cell 10, it is possible to improve the formation pattern of the electrodes and enhance the performance such as the photoelectric conversion efficiency.

Other examples of the embodiment of the present invention will be described with reference to FIG. 4 to FIG. 6 (views corresponding to FIG. 1) and FIG. 7 to FIG. 17 (enlarged views showing a region between the busbar electrodes 20X, 20Y). In the following, the same reference characters are assigned to the same constituent elements as the above embodiment, and repetitive descriptions are omitted. Differences from the above embodiment will be described in detail. Further, the finger parts formed between the busbar electrodes 20X, 20Y will be mainly described.

Figure 4:
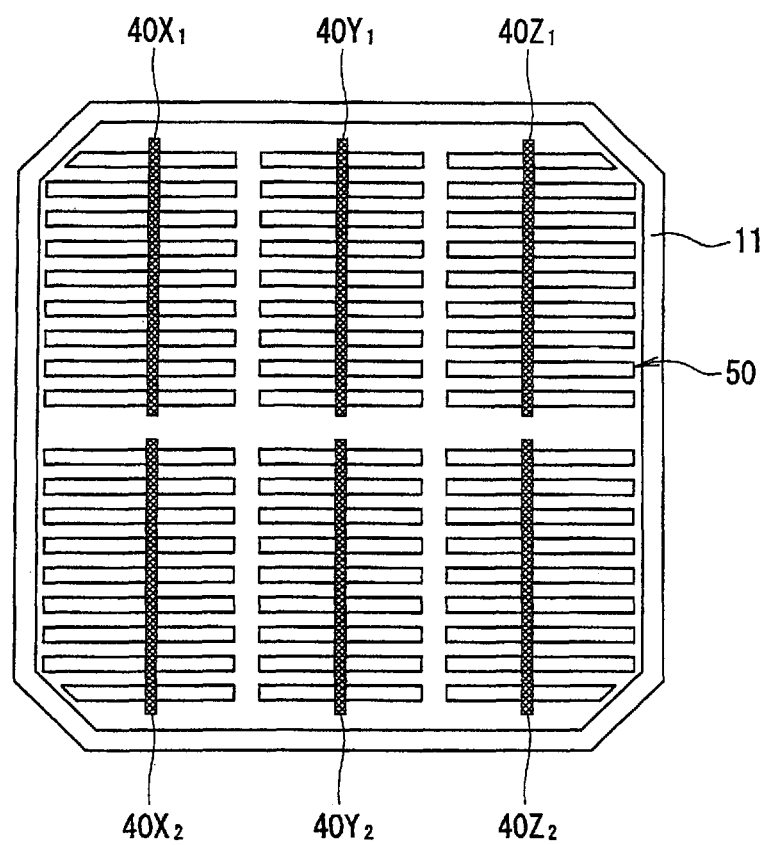
FIG. 4 is a view showing a solar cell that is another example of the embodiment of the present invention.

A mode exemplified in FIG. 4 is different from the above embodiment in that the busbar electrode is divided at a longitudinal intermediate part and multiple busbar electrodes $40X_1$, $40X_2$ are formed on an identical straight line. Similarly, the other busbar electrodes include busbar electrodes $40Y_1$, $40Y_2$ and busbar electrodes $40Z_1$, $40Z_2$. In the example shown in FIG. 3, a region where electrodes (the busbar electrodes and finger electrodes 50) are not formed is provided at the central part on the light receiving surface where the power generation efficiency is high.

Figure 5:
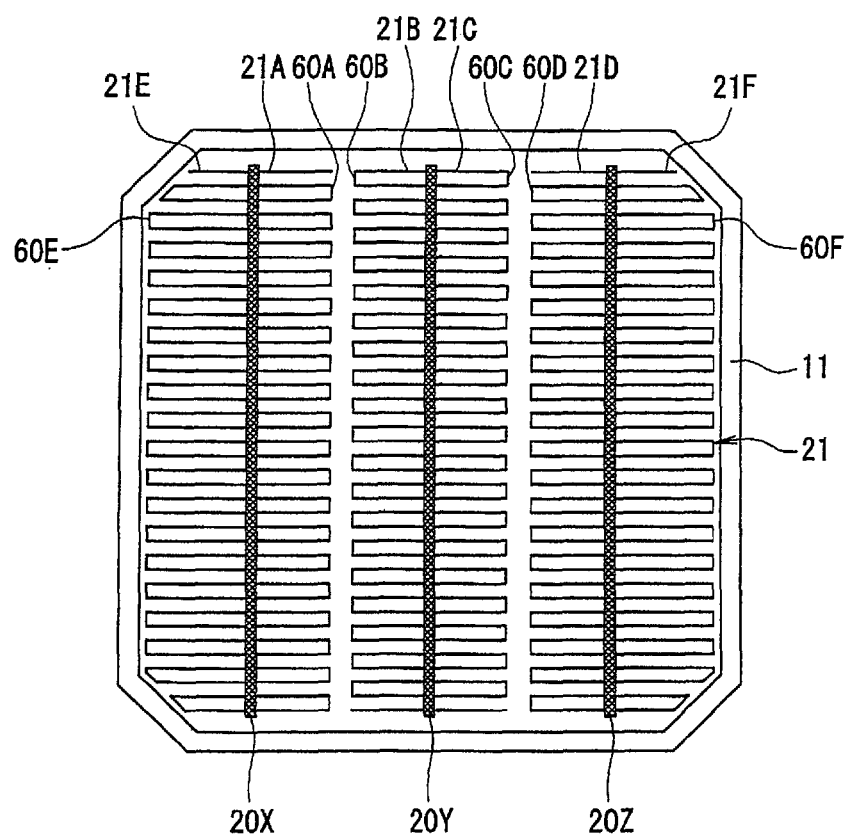
FIG. 5 is a view showing a solar cell that is another example of the embodiment of the present invention.

In a mode exemplified in FIG. 5, connection finger parts 60A connecting the finger parts 21A and connection finger parts 60B connecting the finger parts 21B do not face one another, in the direction orthogonal to the longitudinal direction of the busbar electrodes 20X, 20Y. There is a difference from the above embodiment in that the connection finger parts 60A, 60B are alternately arranged along the longitudinal direction of the busbar electrodes 20X, 20Y and are formed in a zigzag manner Here, the finger parts that are of the multiple finger parts 21A to 21F and that are positioned at ends of the arrays are not connected to the adjacent finger parts, and are independently formed.

The mode exemplified in FIG. 5 enhances the conversion efficiency at a region where the straight-linear finger part is divided. Specifically, carriers generated at the region where the finger part is divided are collected by the closest finger part. At this time, the mode exemplified in FIG. 1 has a high likelihood of the closest finger part being a corner part where the finger part (21A, 21B) and the connection finger part (22A, 22B) are connected. Compared to the case where the closest finger part is a linear part, the case of being a corner part leads to a decrease in the conversion efficiency, from the standpoint of the current density. Therefore, the mode exemplified in FIG. 5, has a configuration in which all regions where the finger parts are divided are provided with at least one of the connection finger parts 60A, 60B, resulting in enhancement of the conversion efficiency.

Figure 6:
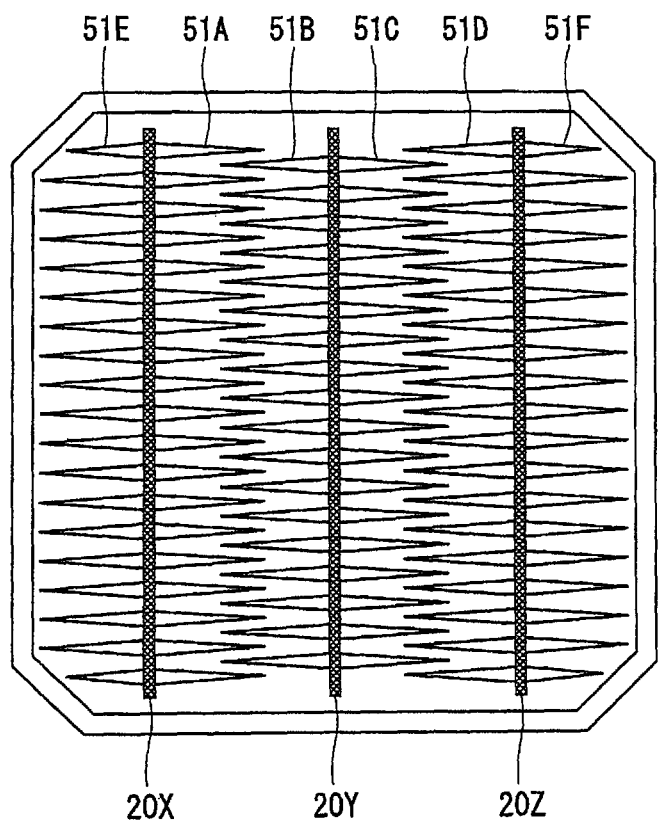
FIG. 6 is a view showing a solar cell that is another example of the embodiment of the present invention.

A mode exemplified in FIG. 6 is different from the above embodiment in that finger parts 51A are directly connected. Further, each finger part 51A is formed diagonally to the direction perpendicular to the busbar electrode 20X. Specifically, adjacent finger parts 51A have different inclination angles, and the respective finger parts 51A are formed such that the end parts intersect in pairs and the connection parts have a pointed and nearly V shape.

Similarly, the respective finger parts 51B are formed so as to have a nearly V shape. Then, in the direction orthogonal to the longitudinal direction of the busbar electrodes 20X, 20Y, the finger part 51A extends to the side of busbar electrode 20Y beyond the end part of the finger part 51B, and the finger part 51B extends to the side of the busbar electrode 20X beyond the end part of the finger part 51A. The respective finger parts 51A, 51B are alternately formed along the longitudinal direction of the busbar electrodes 20X, 20Y, so as not to overlap with one another.

Figure 7:
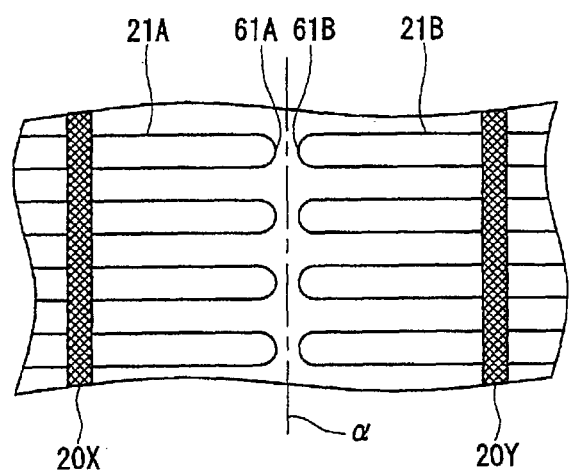
FIG. 7 is a view showing a solar cell that is another example of the embodiment of the present invention.
Figure 8:
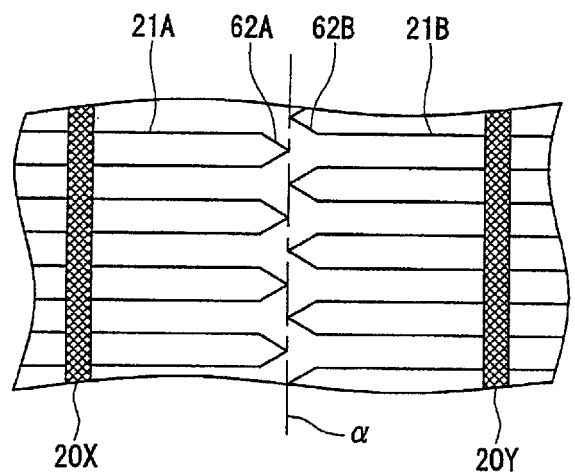
FIG. 8 is a view showing a solar cell that is another example of the embodiment of the present invention.

Modes exemplified in FIGS. 7 and 8 are different from the modes exemplified shown in FIGS. 1 and 4 in the shape of the connection part. Connection finger parts 61A, 61B shown in FIG. 7 are formed by being curved so as to be convex to the side of the facing connection finger part. Connection finger parts 62A, 62B shown in FIG. 8 respectively extend from the end parts of the finger parts 21A, 21B to the side of a center line α, which indicates exactly the center between the busbar electrodes 20X, 20Y with respect to the direction orthogonal to the longitudinal direction of the busbar electrodes 20X, 20Y. The connection finger parts 62A, 62B are formed in a nearly V shape, and are alternately formed along the longitudinal direction of the busbar electrodes 20X, 20Y such that the respective end parts contact with the center line α and do not overlap with one another.

Figure 9:
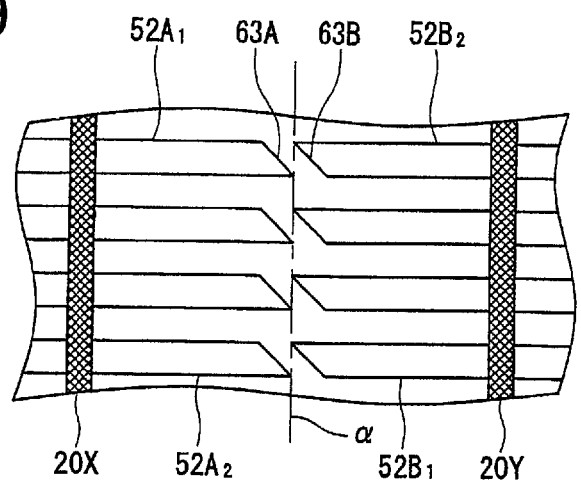
FIG. 9 is a view showing a solar cell that is another example of the embodiment of the present invention.

In a mode exemplified in FIG. 9, adjacent finger parts have different lengths, and short finger parts $52A_1$, $52B_1$ and long finger parts $52A_2$, $52B_2$ are alternately formed, respectively. Then, the finger parts $52A_2$, $52B_2$ extend to the center line α. The finger parts $52A_1$, $52B_2$ are formed on an identical straight line, and the finger parts $52A_2$, $52B_1$ are formed on an identical straight line. Connection finger parts 63A, 63B are formed, nearly parallel to one another, from the intersection points between the finger parts $52A_2$, $52B_2$ and the center line α, toward the end parts of the finger parts $52A_1$, $52B_1$, respectively.

Figure 10:
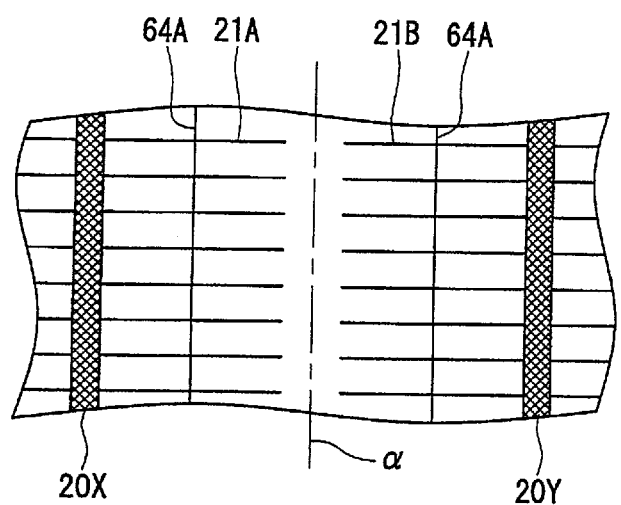
FIG. 10 is a view showing a solar cell that is another example of the embodiment of the present invention.

A mode exemplified in FIG. 10 is different from the above embodiment in that three or more finger parts 21A, for example, all finger parts 21A, are connected by a connection finger part 64A. Further, the connection finger part 64A is formed so as to be nearly perpendicular to each finger part 21A, through the longitudinal intermediate part of each finger part 21A. In other words, the finger electrode shown in FIG. 10 has a divergence point where it diverges in multiple directions, at the longitudinal intermediate part. The length of the connection finger part 64A, for example, may be similar to the length of the busbar electrode 20X. Similarly, a connection finger part 64B connects three or more finger parts 21B. Here, the connection finger part 64A shown in FIG. 10 is formed so as to be nearly perpendicular to the busbar electrode 20X, but does not need to be nearly perpendicular. It is only necessary that the extending directions of the finger part 64A and the busbar electrode 20X intersect.

Figure 11:
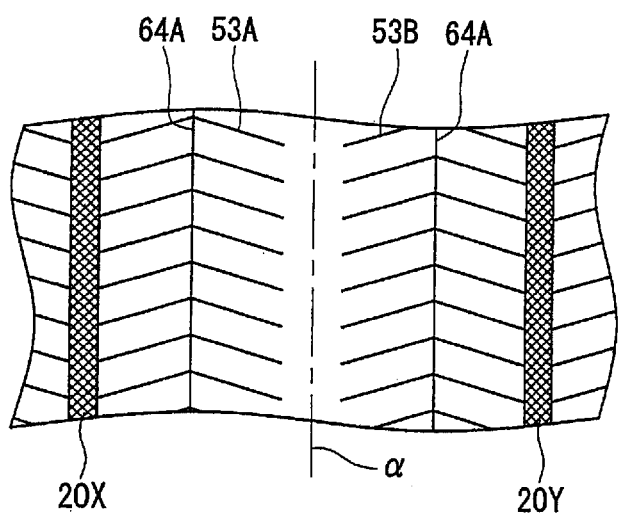
FIG. 11 is a view showing a solar cell that is another example of the embodiment of the present invention.

A mode exemplified in FIG. 11 is common to the mode shown in FIG. 10 in that three or more finger parts 53A are connected by the connection finger part 64A passing through each longitudinal intermediate part. However, it is different from the mode shown in FIG. 10 in that each finger part 53A is formed in a mountain shape by bending at the longitudinal intermediate part. For example, other finger parts including finger parts 53B are also formed in a mountain shape so as to be convex in the same direction. The electrode pattern shown in FIG. 11 has a fishbone-like shape in which the connection finger part 64A is a backbone.

Figure 12:
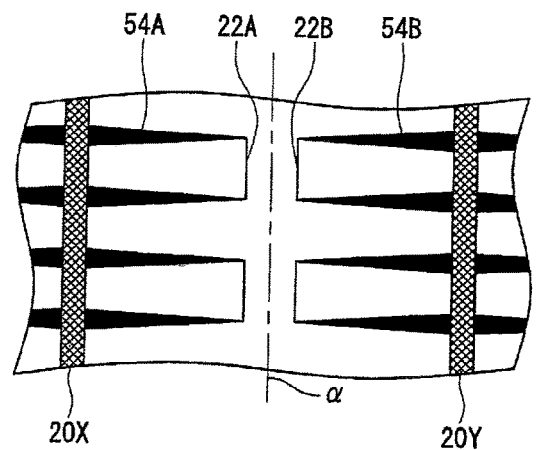
FIG. 12 is a view showing a solar cell that is another example of the embodiment of the present invention.

A mode exemplified in FIG. 12 is different from the mode shown in FIG. 1 in that the width of finger parts 54A is thicker at base parts connected to the busbar electrode 20X, than at the end parts and the central parts. The finger part 54A is formed in a nearly triangular shape in which the width gradually increases closer to the base part from the end part. In the respective finger parts 54A, the end parts are connected in pairs by the connection finger part 22A. Here, finger parts 54B have the same shape as the finger parts 54A.

Figure 13:
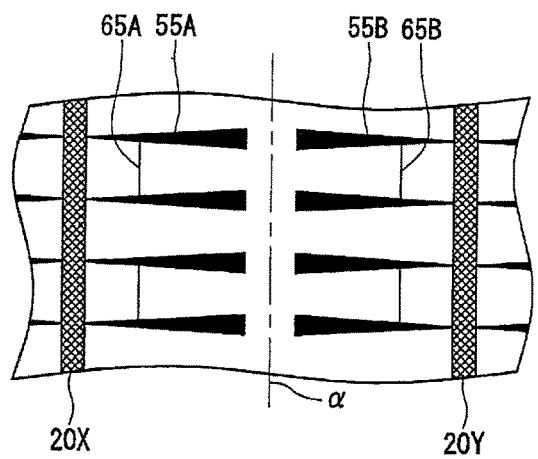
FIG. 13 is a view showing a solar cell that is another example of the embodiment of the present invention.

A mode exemplified in FIG. 13 is common to the mode shown in FIG. 12 in that finger parts 55A are formed in a nearly triangular shape. However, there is a difference from the mode shown in FIG. 12 in that the width of the finger parts 55A gradually increases closer to the end part from the base part. Further, connection finger parts 65A are formed near the base parts where the width of the finger parts 55A is thin. Here, finger parts 55B and connection finger parts 65B have the same shapes as the finger parts 55A and the connection finger parts 65A, respectively.

Figure 14:
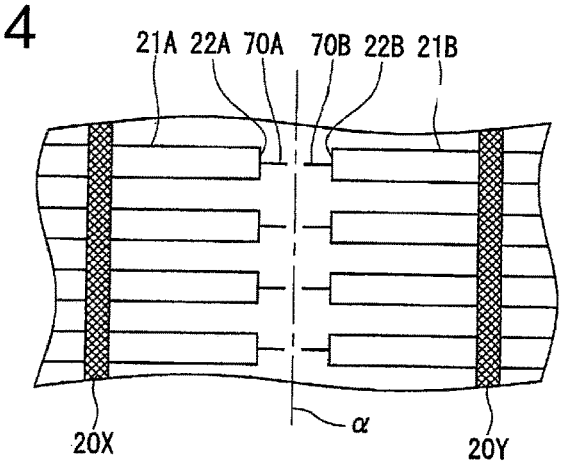
FIG. 14 is a view showing a solar cell that is another example of the embodiment of the present invention.

A mode exemplified in FIG. 14 is different from the mode shown in FIG. 1 in that extension finger parts 70A are formed extending from the connection finger parts 22A to the side of the busbar electrode 20Y nearly parallel to the finger parts 21A. The extension finger parts 70A are formed on nearly identical straight-lines to extension finger parts 70B extending from the connection finger parts 22B. However, the extension finger parts 70A, 70B may be formed nearly parallel to one another and diagonally to the finger parts 21A, 21B. By providing the extension finger parts 70A, 70B, it is possible to increase the current collection property at the region between the finger parts 21A, 21B.

Figure 15:
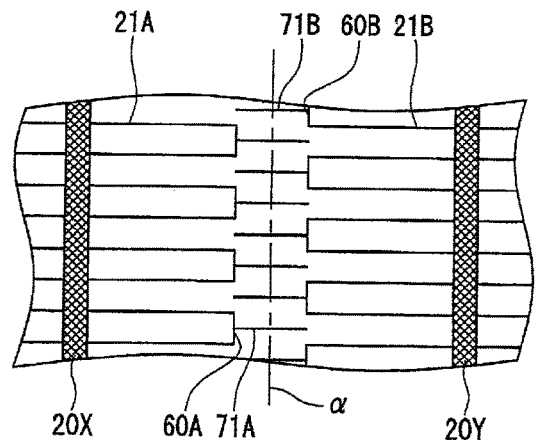
FIG. 15 is a view showing a solar cell that is another example of the embodiment of the present invention.

A mode exemplified in FIG. 15 is different from the mode shown in FIG. 5 in that extension finger parts 71A are formed extending from the connection finger parts 60A to the side of the busbar electrode 20Y nearly parallel to the finger parts 21A. The extension finger parts 71A extend to the side of the busbar electrode 20Y beyond the center line α, and similarly, extension finger parts 71B extending from the connection finger parts 60B extend to the side of the busbar electrode 20X beyond the center line α.

Figure 16:
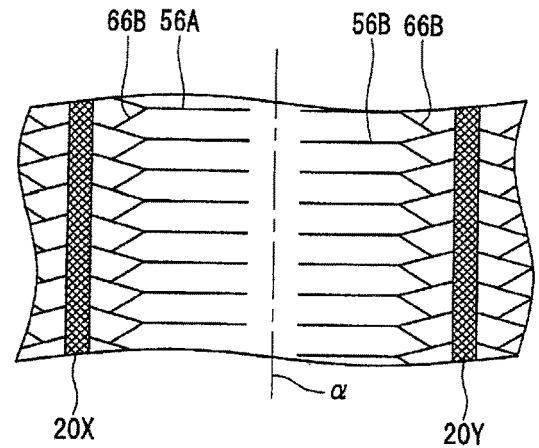
FIG. 16 is a view showing a solar cell that is another example of the embodiment of the present invention.

In a mode exemplified in FIG. 16, finger parts 56A have a shape in which they diverge near the base parts. Specifically, the finger parts 56A extend to the busbar electrode 20X and bend near the base parts. Connection finger parts 66A are formed extending to adjacent finger parts 56A such that the bending parts are divergence points. For example, the connection finger parts 66A diverge from all bending parts, and all finger parts 56A are connected to one another.

Figure 17:
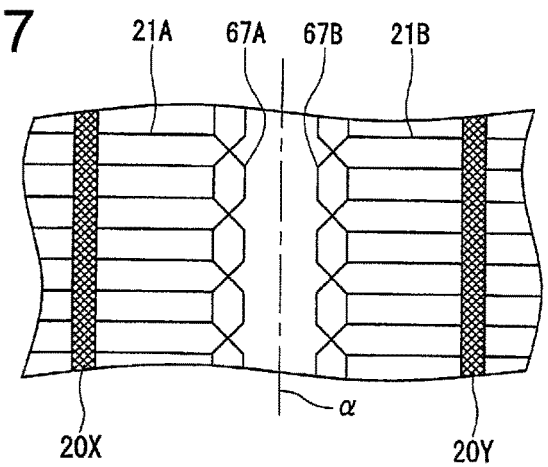
FIG. 17 is a view showing a solar cell that is another example of the embodiment of the present invention.

In a mode exemplified in FIG. 17, an array of connection finger parts 67A is formed in which hexagonal shapes are continuously arranged such that a side of each hexagonal shape connects the end parts of adjacent finger parts 21A. Further, in the array of the connection finger parts 67A, the continuous hexagonal shapes are formed such that, for facing vertexes of the hexagonal shapes, the vertexes of the hexagonal shapes overlap. Also at the end parts of the finger parts 21B, an array of connection finger parts 67B formed in a hexagonal shape is formed. The two arrays are formed nearly parallel along the longitudinal direction of the busbar electrodes 20X, 20Y.

Other than the modes exemplified in FIG. 4 to FIG. 17, various modes are possible. For example, a plurality of the arrays of the hexagonal shapes shown in FIG. 17 may be provided, and as a result the connection part may have a honeycomb structure.

The invention claimed is:
1. A solar cell comprising:
a first busbar electrode and a second busbar electrode spaced apart from one another;
   a plurality of first finger electrodes spaced apart in a longitudinal direction of the first busbar electrode, each of the plurality of first finger electrodes comprising a first finger part connected to only the first busbar electrode;
   a plurality of second finger electrodes spaced apart in a longitudinal direction of the second busbar electrode, each of the plurality of second finger electrodes comprising a second finger part connected to only the second busbar electrode;
wherein the plurality of first finger electrodes are arranged into a plurality of first finger groups and the plurality of second finger electrodes are arranged into a plurality of second finger groups;
   wherein, within each first finger group of the plurality of first finger groups, end portions of each of the plurality of first finger electrodes are connected by first connection finger parts, the end portions of each of the plurality of first finger electrodes being opposite to the first busbar electrode in a longitudinal direction of the plurality of first finger electrodes; and
   wherein within each second finger group of the plurality of second finger groups, end portions of each second finger electrodes are connected by second connection finger parts, the end portions of each of the plurality of second finger electrodes being opposite to the second busbar electrode in a longitudinal direction of the plurality of second finger electrodes;
   wherein no direct connection is formed between the first connection finger parts and the second connection finger parts;
   wherein adjacent first finger groups of the plurality of first finger groups are spaced apart from each other in the longitudinal direction of the first busbar electrode and no direct connection via the first connection finger part is formed between adjacent first finger groups, and
   wherein adjacent second finger groups of the plurality of second finger groups are spaced apart from each other in the longitudinal direction of the second busbar electrode and no direct connection via the second connection finger part is formed between adjacent finger groups;

wherein the plurality of the first finger groups and the plurality of the second finger groups are disposed between the first busbar electrode and the second busbar electrode;

the plurality of the first finger electrodes extend from both width-wise sides of the first busbar electrode; and the plurality of the second fingers electrodes extend from both width-wise sides of the second busbar electrode.

2. The solar cell according to claim 1, wherein an interval between an end portion of a first finger electrode of the plurality of first finger electrodes and an end portion of a corresponding second finger electrode of the plurality of second finger electrodes is less than an interval between the adjacent first finger electrodes and an interval between the adjacent second finger electrodes.

3. The solar cell according to claim 1, wherein one of the first finger groups comprises a pair of first finger electrodes directly connected to each other; or one of the second finger groups comprises a pair of second finger electrodes directly connected to each other.

4. The solar cell according to claim 1, wherein a first finger electrode of the plurality of first finger electrodes comprises the end portion, a base portion opposite to the end portion and proximate to the first busbar electrode, and a central portion between the end portion and the base portion, a thickness of the base portion or the end portion in the longitudinal direction of the first busbar electrode being larger than a thickness of the central portion in the longitudinal direction of the first busbar electrode; or a second finger electrode of the plurality of second finger electrodes comprises the end portion, a base portion opposite to the end portion and proximate to the second busbar electrode, and a central portion between the end portion and the base portion, a thickness of the base portion or the end portion in the longitudinal direction of the second busbar electrode being larger than a thickness of the central portion in the longitudinal direction of the second busbar electrode.

5. The solar cell according to claim 1, a first finger electrode or a second finger electrode comprises a divergence point where the first finger electrode or the second finger electrode diverges in multiple directions.

6. The solar cell according to claim 1, within each first finger group of the plurality of first finger groups a first extension finger part extends from the connection part of the toward the second busbar electrode; and within each second finger group of the plurality of second finger groups a second extension finger part extends from the connection part of the toward the first busbar electrode.

7. The solar cell according to claim 1, wherein the first finger groups and the second finger groups face each other in the longitudinal direction of the plurality of first finger electrodes and the plurality of second finger electrodes.

8. The solar cell according to claim 1, wherein the first finger groups and the second finger groups are formed alternately along the longitudinal direction of the first and the second busbar electrodes.

9. The solar cell according to claim 1, wherein at least a portion of a first connection finger part of the first connection finger parts and at least a portion of a corresponding second connection finger part of the second connection finger parts face each other in the longitudinal direction of the plurality of first finger electrodes and plurality of second finger electrodes.

10. The solar cell according to claim 1, wherein each of the first connection finger parts faces a corresponding one of the second connection finger parts between the first busbar electrode and the second busbar electrode.

* * * * *